US006992900B1

(12) United States Patent
Suzue et al.

(10) Patent No.: US 6,992,900 B1
(45) Date of Patent: Jan. 31, 2006

(54) BOARD UNIT

(75) Inventors: Osamu Suzue, Yao (JP); Masaharu Morimoto, Yao (JP)

(73) Assignee: Uber Co., Ltd., Osaka (JP)

( * ) Notice: Subject to any disclaimer, the term of this patent is extended or adjusted under 35 U.S.C. 154(b) by 0 days.

(21) Appl. No.: 11/152,746

(22) Filed: Jun. 14, 2005

(30) Foreign Application Priority Data

| Jul. 20, 2004 | (JP) | ............................... 2004-211233 |
| Feb. 25, 2005 | (JP) | ............................... 2005-050231 |

(51) Int. Cl.
*H05K 7/12* (2006.01)
(52) U.S. Cl. .................. 361/801; 361/798; 361/759; 361/747; 361/740; 361/754; 361/726; 361/732
(58) Field of Classification Search ................ 361/798, 361/801, 759, 754, 741, 740, 726, 732, 747
See application file for complete search history.

(56) References Cited

U.S. PATENT DOCUMENTS

| 4,233,646 A | * | 11/1980 | Leung et al. ................ 361/752 |
| 4,313,150 A | * | 1/1982 | Chu ............................ 361/755 |
| 4,632,588 A | * | 12/1986 | Fitzpatrick .................... 403/16 |
| 5,162,979 A | * | 11/1992 | Anzelone et al. ........... 361/686 |
| 5,309,325 A | * | 5/1994 | Dreher et al. ................ 361/754 |
| 6,185,106 B1 | * | 2/2001 | Mueller ....................... 361/798 |
| 6,256,191 B1 | * | 7/2001 | Curlee ......................... 361/683 |
| 6,269,007 B1 | * | 7/2001 | Pongracz et al. ............ 361/759 |
| 6,373,713 B1 | * | 4/2002 | Jensen et al. ............... 361/759 |
| 6,381,146 B1 | * | 4/2002 | Sevier ......................... 361/754 |
| 6,916,190 B2 | * | 7/2005 | Joist ............................ 439/160 |

FOREIGN PATENT DOCUMENTS

JP         WO 03/086039         10/2003

* cited by examiner

*Primary Examiner*—Kamand Cuneo
*Assistant Examiner*—Dameon E. Levi
(74) *Attorney, Agent, or Firm*—Hogan & Hartson, L.L.P.

(57) ABSTRACT

To provide a board unit having an insertion-extraction handle locking structure with which a desired locking force can be easily generated and the locking force is hardly lowered, and which is low in production cost. An insertion-extraction handle 5 is rotatably supported by a panel body 4. A spring unit 6 is resiliently held in a spring receiving hole 45 formed in the panel body 4 and has a first spring part 61 which, when a stopper part 53 of the insertion-extraction handle 5 is inserted into the spring receiving hole 45, applies a resistance to the insertion of the stopper part 53, and which, when the stopper part 53 is extracted from the spring receiving hole 45, applies a resistance to the extraction of the stopper part 53. Second spring parts 62 of the spring unit 6 are configured to generate a resistance to removal of the spring unit 6 which is greater than the resistance to the insertion of the stopper part 53 between the spring unit 6 and the spring receiving hole 45 when the stopper part 53 is inserted into the spring receiving hole 45 and to generate a resistance to removal of the spring unit 6 which is greater than the resistance to the extraction of the stopper part 53 between the spring unit 6 and the spring receiving hole 45 when the stopper part 53 is extracted from the stopper receiving hole 45.

20 Claims, 14 Drawing Sheets

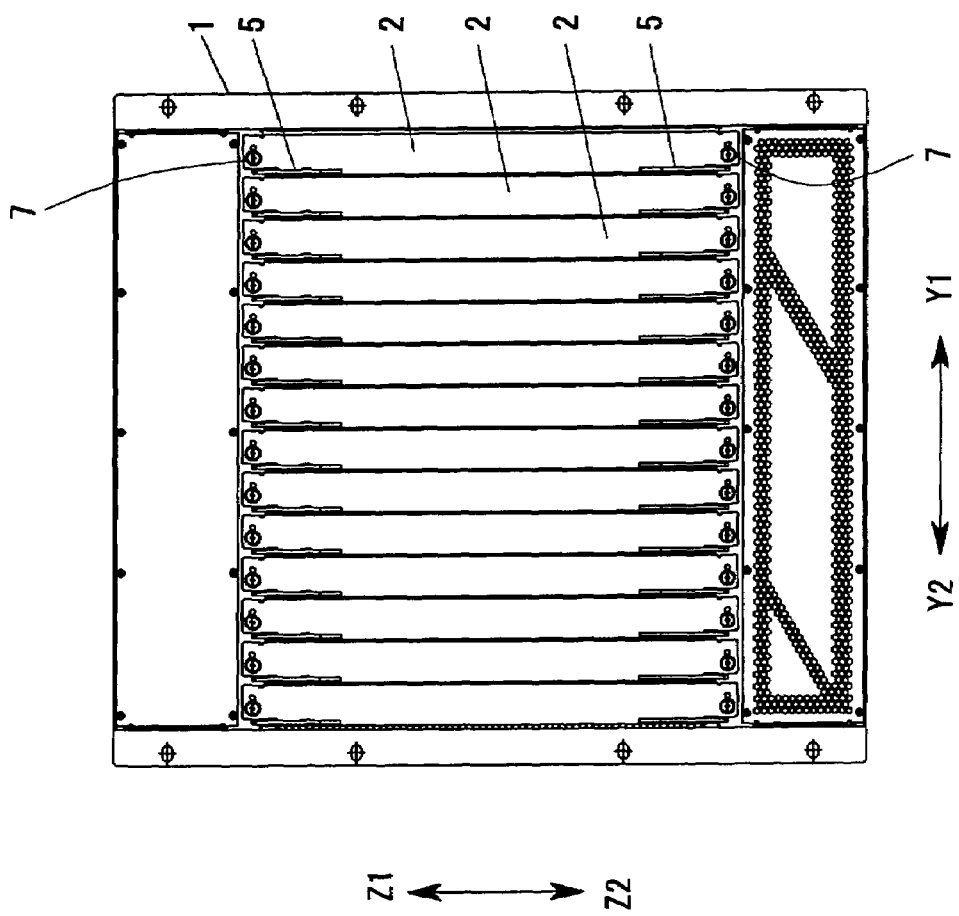

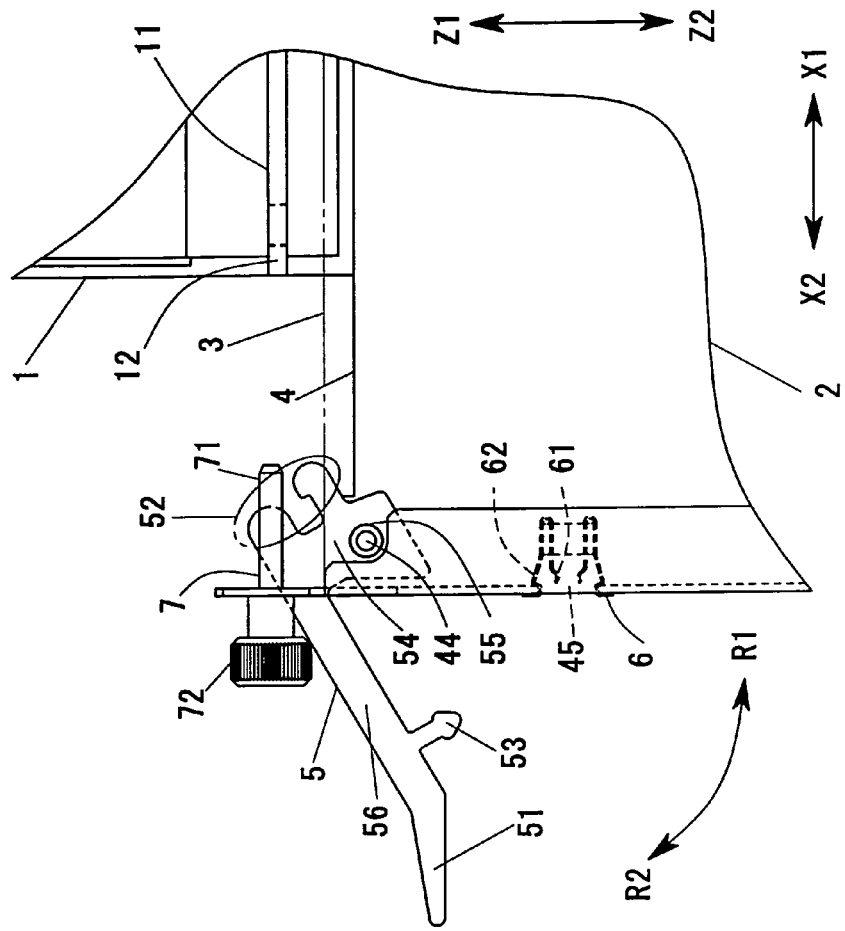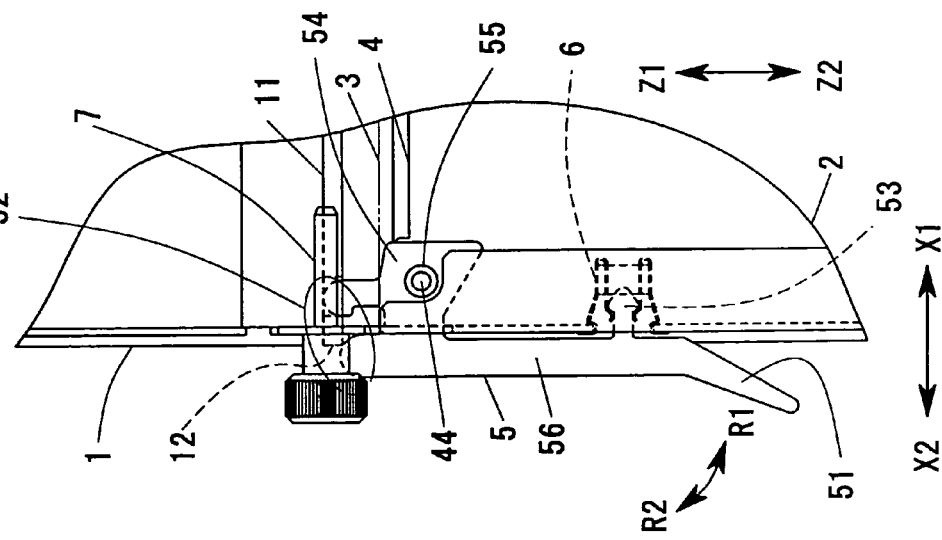

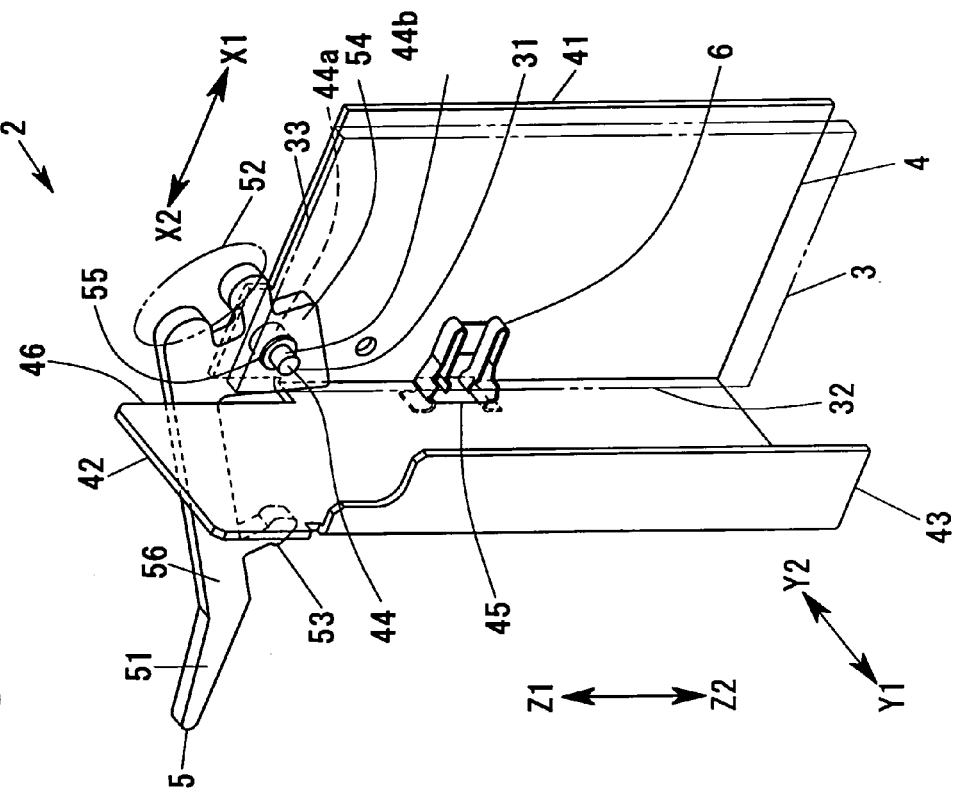
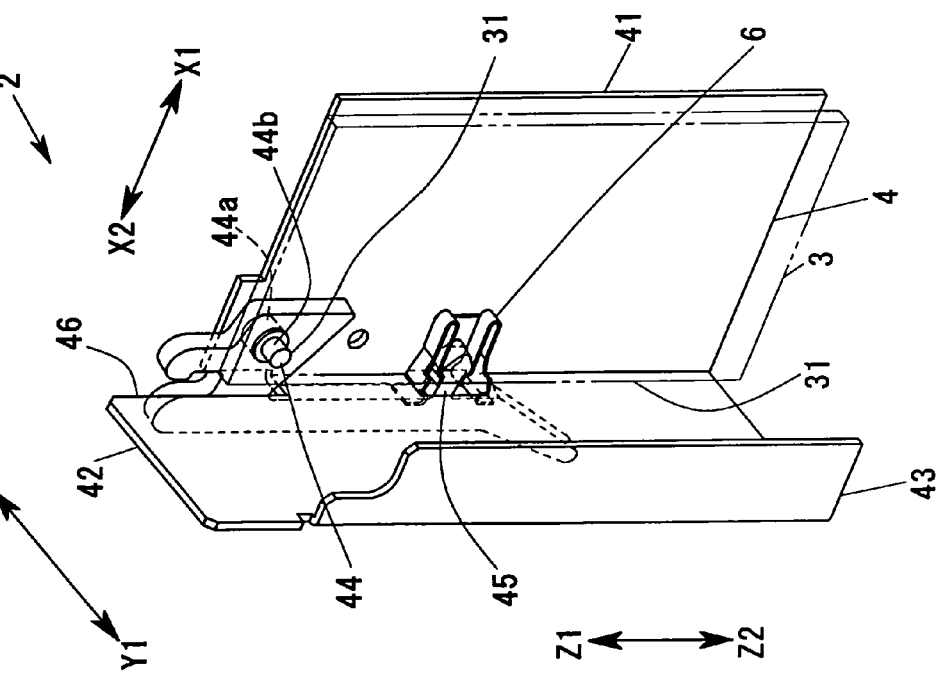

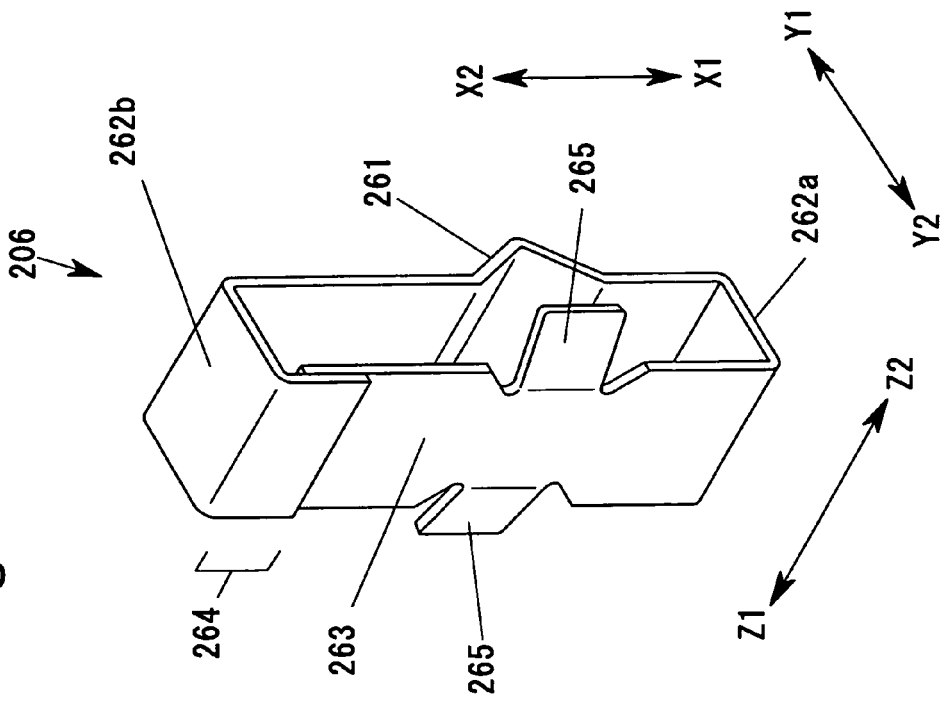
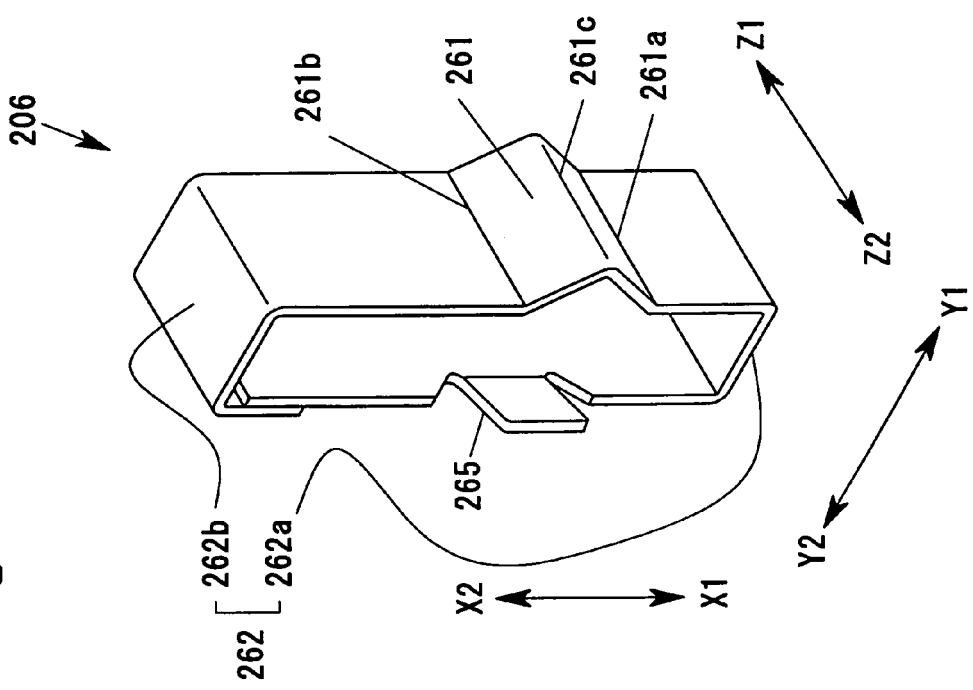

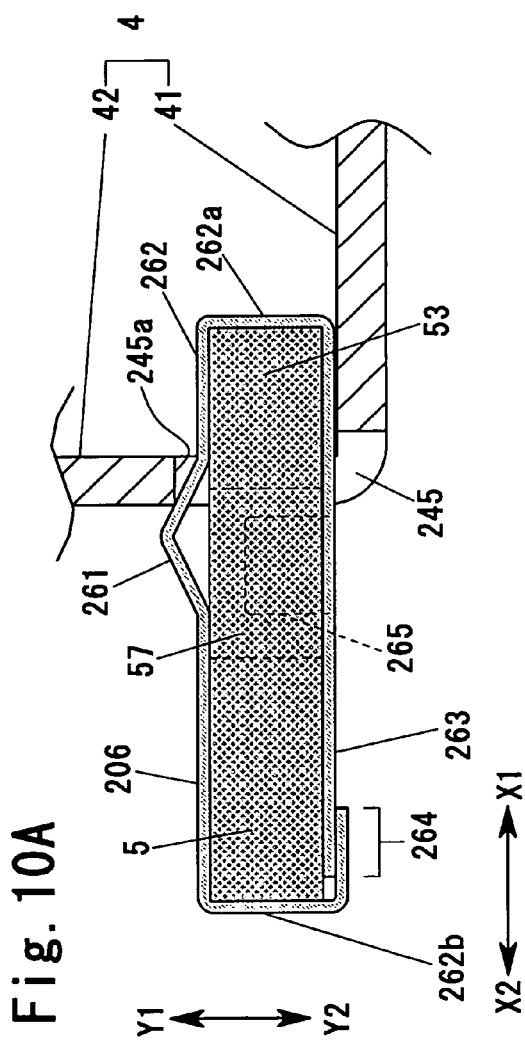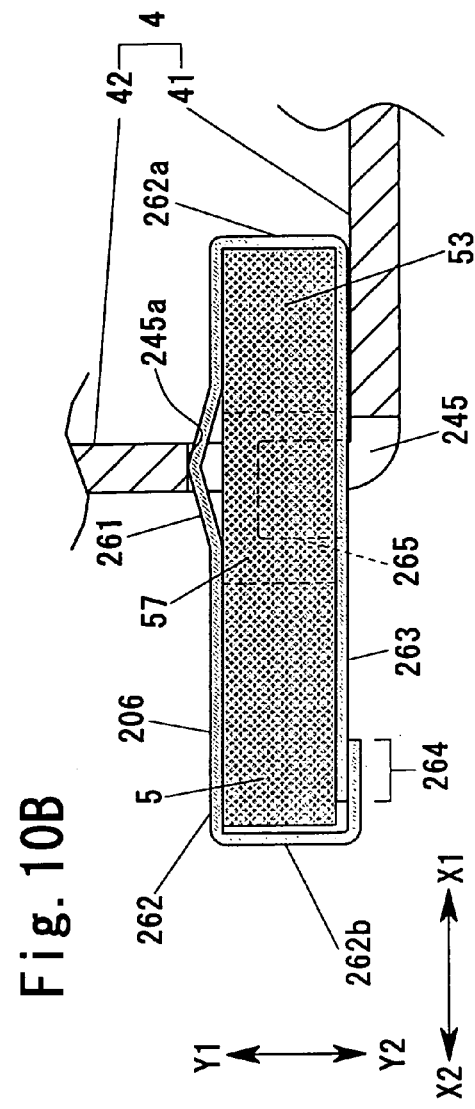

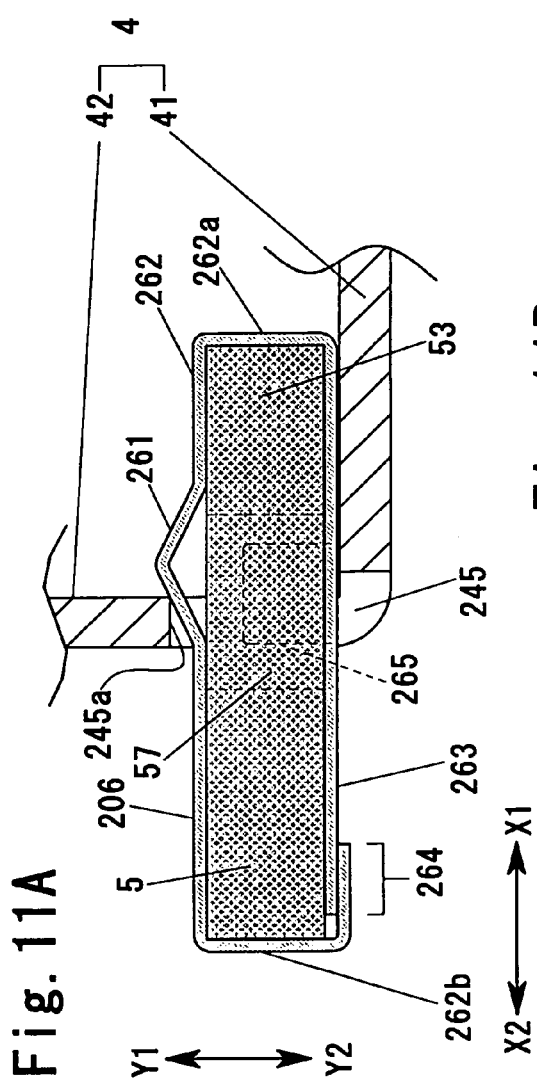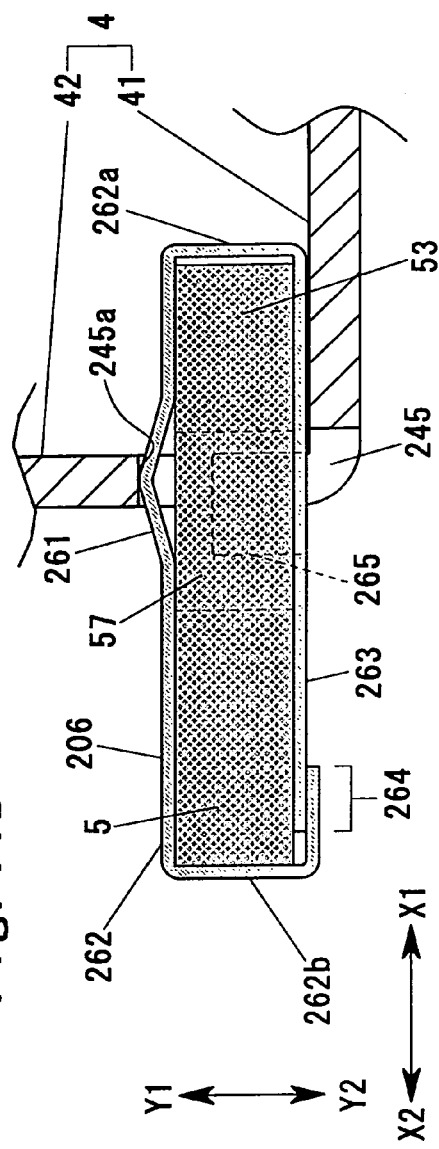
Fig. 11A
Fig. 11B

BOARD UNIT

CROSS REFERENCE OF RELATED APPLICATIONS

The disclosure of Japanese Patent Applications No. 2004-211233 (filed Jul. 20, 2004) and No. 2005-50231 (filed Feb. 25, 2005) including the specification, claims, drawings and abstract is incorporated herein by reference in its entirety.

BACKGROUND OF THE INVENTION

1. Technical Field

The present invention relates to a board unit, and more particularly, to a board unit which is removably attachable to a board housing frame.

2. Background Art

A technology for detachably attaching a circuit board on which electronic circuit components are mounted such as a print circuit board to a subrack constituting an electronic apparatus unit such as a communication device is known (for example, see "Background Art" in Patent Document 1: International Publication No. W003/086039). In this example, a rectangular parallelepiped subrack 120 has a housing section 121 with an opening 121a on the front side for housing a plurality of circuit boards as shown in FIGS. 12A and 12B. In the housing section 121, guide rails 127, . . . , 127 extend from the opening 121a toward the bottom. Front rails 124 and 124 are provided on the side of the opening 121a in the upper and lower panels of the subrack 120. Each of the front rails 124 has first handle contact parts 125 and second handle contact parts 126.

As shown in FIG. 13, a circuit board 110 has a board connector 115 on its rear end, which is the right end as viewed in the drawing. The circuit board 110 has a front panel 111 on its front end, which is the left end as viewed in the drawing, and a pair of upper and lower insertion-extraction handles 100 and 100 at the upper and lower end of the front panel 111.

As shown in FIG. 14A, each of the insertion-extraction handles 100 has an lockable part 102 on the rear end removably lockable with a handle locking part 112 provided on the circuit board 110, a contactable part 103 having first and second contactable parts 103a and 103b contactable with the first and second handle contact parts 125 and 126, respectively, of the front rail 124 of the subrack 120, and a pivot pin 104, located between the lockable part 102 and the contactable part 103, rotatably attached to a handle attaching member 140 provided on the circuit board 110. Each of the insertion-extraction handles 100 has a pressing operation part 100 with a first pressing operation part 101a and a second pressing operation part 101b at the front end. When the circuit board 110 is inserted into the subrack 120, the lockable parts 102 of the insertion-extraction handles 100 are removed from the handle locking parts 112 as shown in FIG. 14B and the circuit board 110 is inserted into the subrack 120. Then, the first pressing operation parts 101a of the insertion-extraction handles 100 are pressed upward as viewed in FIG. 14B (in the direction indicated by the arrow R1). The insertion-extraction handles 100 are thereby rotated about the pivot pins 104, and the first contactable parts 103a of the insertion-extraction handles 100 are brought into contact with the first handle contact parts 125 of the front rails 124 of the subrack 120. When the insertion-extraction handles 100 are further rotated, the first contactable parts 103a are rotated. Then, the circuit board 110 is moved backward (in the X1 direction in the drawing) with respect to the subrack 120 and the board connector 115 of the circuit board 110 is inserted into a subrack side connector (not shown) in the subrack 120. In this state, the lockable parts 102 of the insertion-extraction handles 100 are engaged with the handle locking parts 112 as shown in FIG. 14A.

When the circuit board 110 having inserted into the subrack 120 is extracted therefrom, the second pressing operation parts 101b of the insertion-extraction handles 100 are pressed downward as viewed in the drawing (the direction indicated by the arrow R2), that is, in the direction opposite the direction in which the first pressing operation parts 101a are pressed. Then, the engagement between the lockable parts 102 and the handle locking parts 112 are released as shown in FIG. 14B, and the second contactable parts 103b of the insertion-extraction handles 100 and the second handle contact parts 126 of the front rails 124 of the subrack 120 are brought into contact with each other. When the insertion-extraction handles 100 are further rotated, the second contactable parts 103b are rotated. Then, the circuit board 110 is moved forward, that is, leftward as viewed in the drawing (in the X2 direction in the drawing), with respect to the subrack 120 and the board connector 115 of the circuit board 110 can be extracted from the subrack side connector 123 in the subrack 120.

The insertion-extraction handles 100 of the circuit board 110 are made of a synthetic resin and so shaped that they can have resiliency as shown in FIG. 14A. As a result, the lockable parts 102 of the insertion-extraction handles 100 are urged toward the handle locking parts 112 so that the insertion-extraction handles 100 can be locked to the circuit board 110 with a prescribed locking force. This configuration prevents the circuit board 110 inserted into the subrack 120 from being easily extracted from the subrack 120.

It is, however, difficult to obtain a desired locking force only by changing the shape of the insertion-extraction handles 100. Also, the insertion-extraction handles 100 have a problem in durability. When the insertion and extraction of the circuit board 110 are repeated or the circuit board 110 is left for a long period of time, the locking force may be lowered because of wear or creep of the lockable parts 102 and/or the handle locking parts 112. Further, since the handle locking parts 112 have to be fixedly provided on the circuit board 110, the production process is complicated and the production cost is high.

DISCLOSURE OF THE INVENTION

The present invention has been made to solve the problems of the conventional circuit board and it is, therefore, an object of the present invention to provide a board unit having an insertion-extraction handle locking structure with which a desired locking force can be easily generated and the locking force is hardly lowered, and which is low in production cost. A board unit according to the present invention is a board unit which is removably attachable to a board housing frame. The board unit has a board body; a panel body for fixedly supporting the board body, the panel body having a stopper insertion hole; an insertion-extraction handle rotatably supported by the panel body; and a spring unit non-fixedly held either in the stopper insertion. hole or on the insertion-extraction handle. The insertion-extraction handle has an operation part; a frame engaging part configured to be engaged with a part of the board housing frame when the operation part is rotated to a specific fixed position and to be disengaged from the board housing frame when the operation part is rotated to a specific released position; and a stopper part configured to be inserted into the stopper insertion hole when the operation part is rotated to the fixed position and to be extracted from the stopper insertion hole when the operation part is rotated to the released position. The spring unit has a main spring part which, when the stopper part is inserted into the stopper insertion hole, applies a prescribed resistance to the insertion of the stopper part on the insertion-extraction handle and which, when the stopper part is extracted from the stopper insertion hole, applies a prescribed resistance to the extraction of the stopper part on the insertion-extraction handle.

Although the features of this invention can be expressed as above in a broad sense, the constitution and content of this invention, as well as the object and features thereof, will be apparent by reference to the following disclosure taken in connection with the accompanying drawings.

BRIEF DESCRIPTION OF DRAWINGS

FIG. 1 is a front view of a subrack 1 as a board housing frame, into which a plurality of board units 2 according to one embodiment of the present invention have been inserted;

FIG. 3A is an enlarged view showing a part of FIG. 2A in detail;

FIG. 3B is an enlarged view showing a part of FIG. 2B in detail;

FIG. 4A is a partial perspective view for explaining the state of the board unit 2 inserted into the subrack 1, in which the illustration of the subrack 1 is omitted;

FIG. 4B is a partial perspective view for explaining the state of the board unit 2 extracted from the subrack 1, in which the illustration of the subrack 1 is omitted;

FIG. 8A is a perspective view of a spring unit 206 before being attached to the insertion-extraction handle 5;

FIG. 8B is a perspective view of the spring unit 206 as viewed from an angle different from that of FIG. 8A;

FIGS. 10A and 10B are views for explaining the state of a stopper part 53 of the insertion-extraction handle 5 at the time of being inserted into or extracted from a stopper insertion hole 245 of a panel body 4, which correspond to the cross-section taken along the line XIA—XIA in FIG. 7A;

FIGS. 11A and 11B are views for explaining the state of the stopper part 53 of the insertion-extraction handle 5 at the time of being inserted into or extracted from the stopper insertion hole 245 of the panel body 4, which correspond to the cross-section taken along the line XIA—XIA in FIG. 7A;

BEST MODE FOR CARRYING OUT THE INVENTION

Figure 2B:
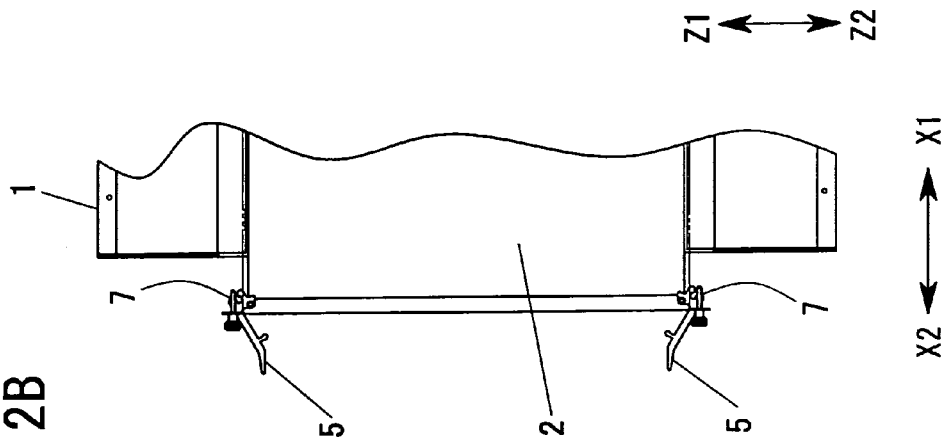
FIG. 2B is a conceptual view for explaining the state of the board unit 2 extracted from the subrack 1, which corresponds to a right side view of the subrack 1.
Figure 2A:
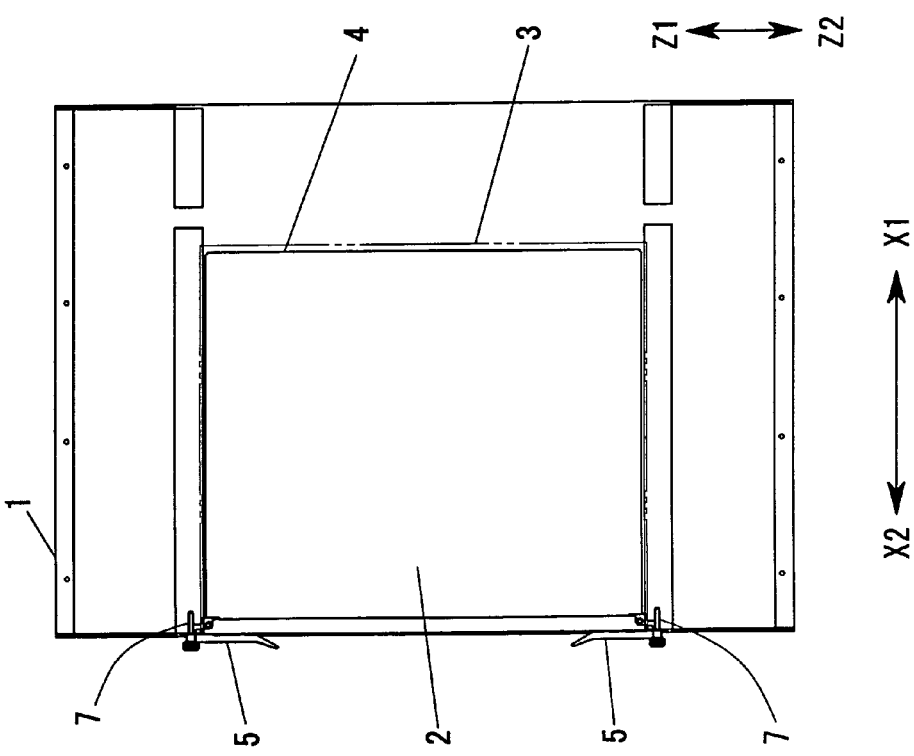
FIG. 2A is a conceptual view for explaining the state of a board unit 2 inserted into the subrack 1, which corresponds to a right side view of the subrack 1.

FIG. 1 is a front view of a subrack 1 as a board housing frame, into which a plurality of (fourteen, in this drawing) board units 2 according to one embodiment of the present invention have been inserted. FIG. 2A is a conceptual view for explaining the state of a board unit 2 inserted into the subrack 1, which corresponds to a right side view of the subrack 1. FIG. 2B is a conceptual view for explaining the state of the board unit 2 extracted from the subrack 1, which corresponds to a right side view of the subrack 1. FIG. 3A is an enlarged view showing a part of FIG. 2A in detail. FIG. 3B is an enlarged view showing a part of FIG. 2B in detail.

Figure 5B:
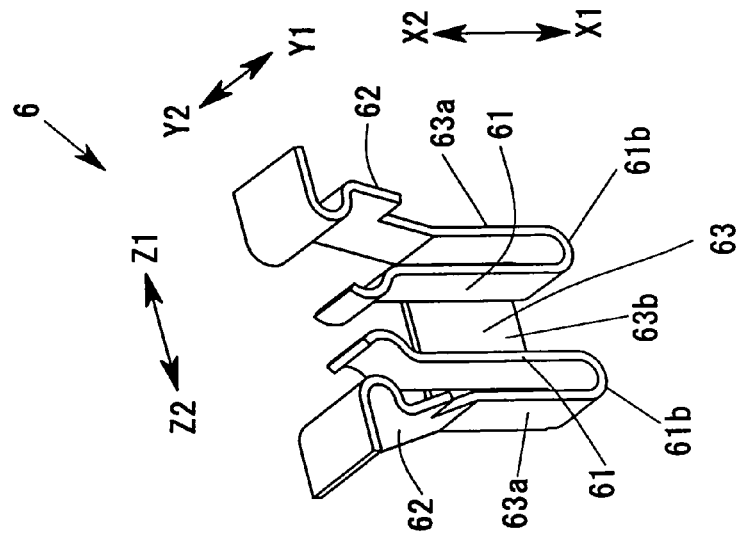
FIG. 5B is a perspective view illustrating the configuration of the spring unit 6.
Figure 5A:
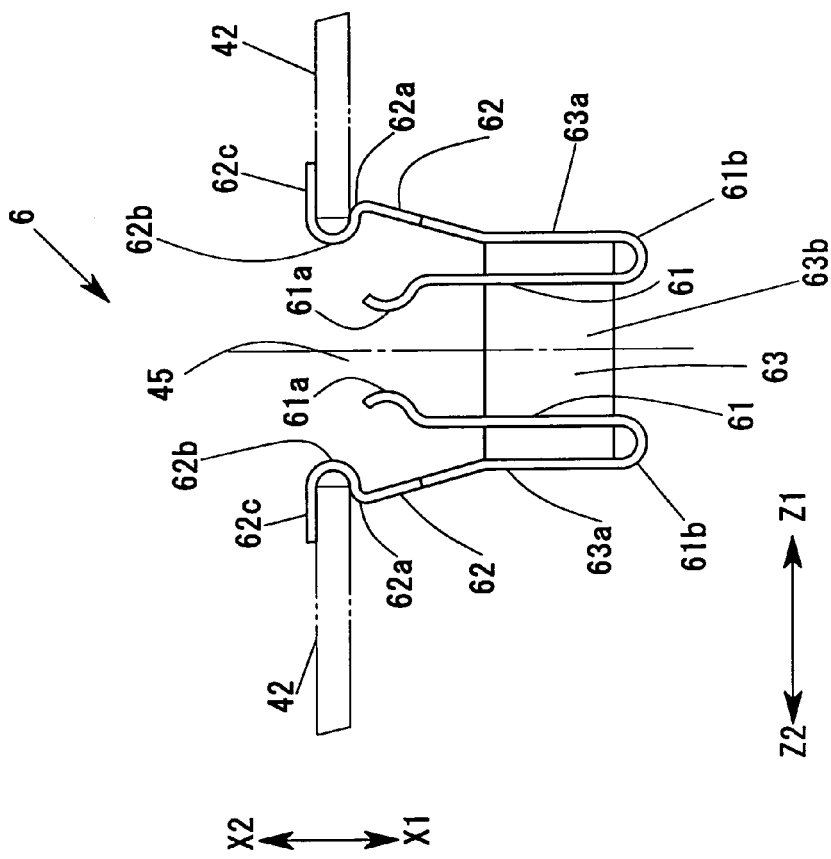
FIG. 5A is a right side view of a spring unit 6 as a spring unit for use in the board unit 2.

FIG. 4A is a partial perspective view for explaining the state of the board unit 2 inserted into the subrack 1, in which the illustration of the subrack 1 is omitted. FIG. 4B is a partial perspective view for explaining the state of the board unit 2 extracted from the subrack 1, in which the illustration of the subrack 1 is omitted. FIG. 5A is a right side view of a spring unit 6 as a spring unit for use in the board unit 2. FIG. 5B is a perspective view illustrating the configuration of the spring unit 6.

Figure 12A:
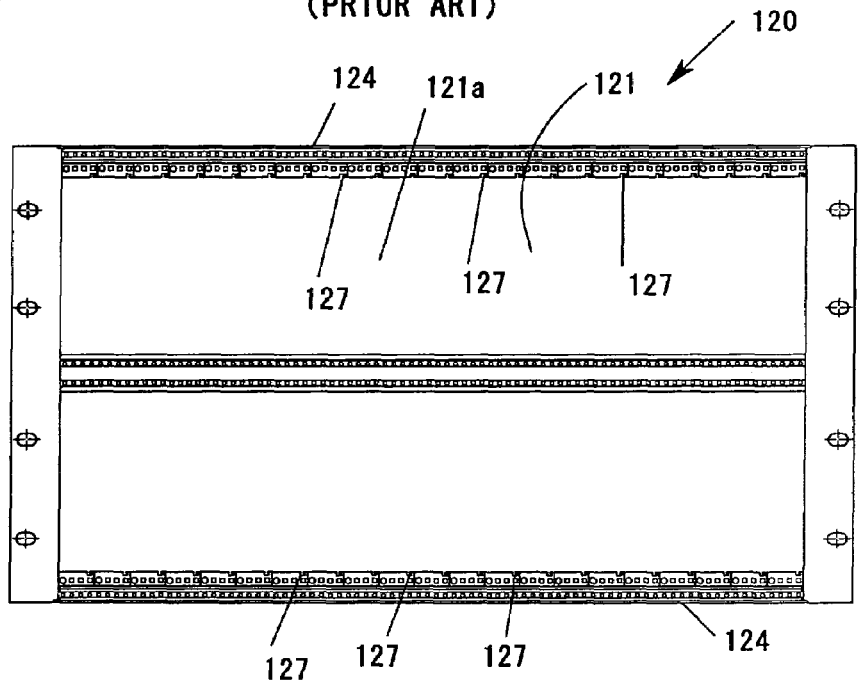
FIG. 12A is a front view of a subrack 120, into which conventional circuit boards 110 will be inserted.
Figure 12B:
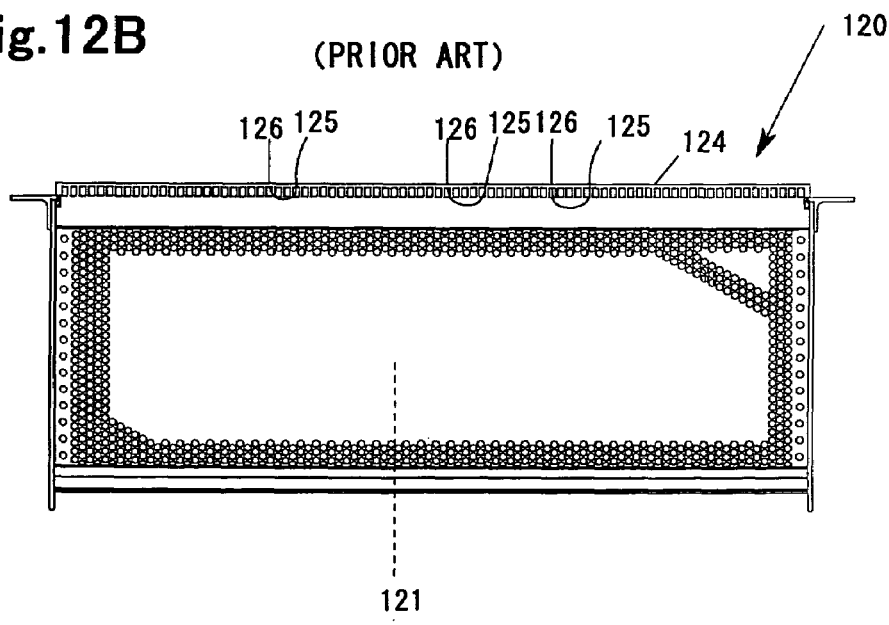
FIG. 12B is a bottom view of the subrack 120.
Figure 13:
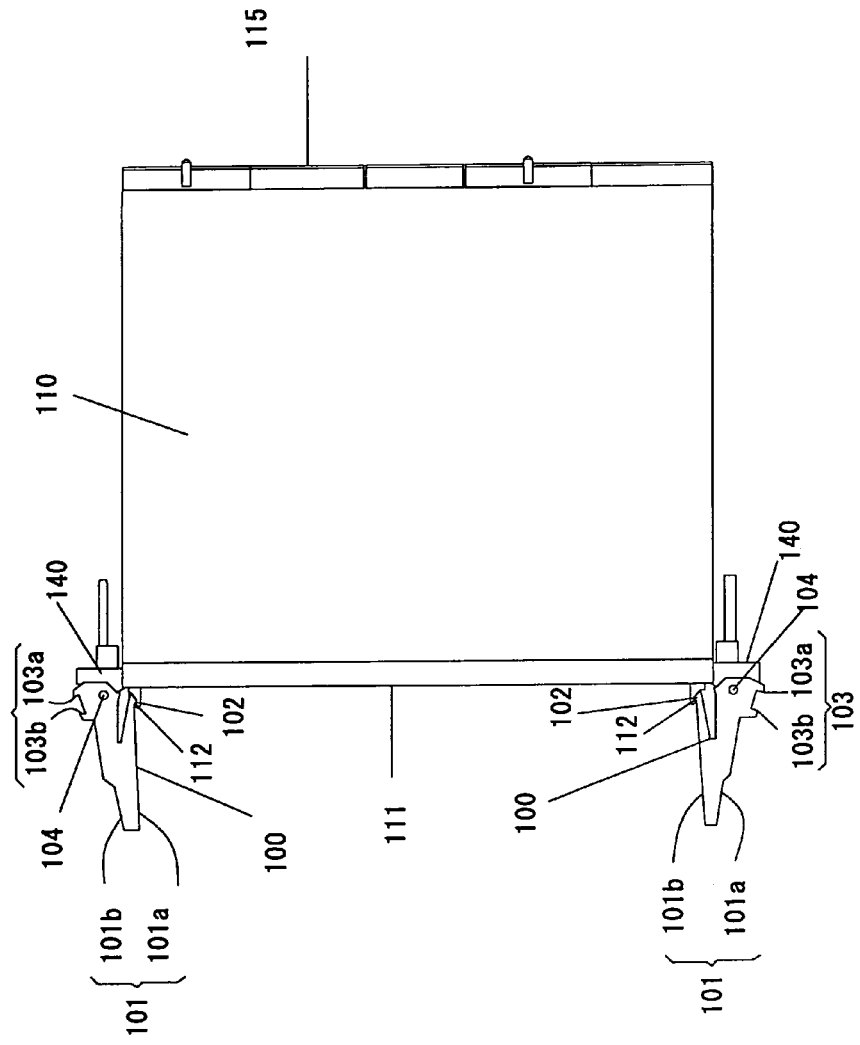
FIG. 13 is a side view of a conventional circuit board 110.
Figure 14A:
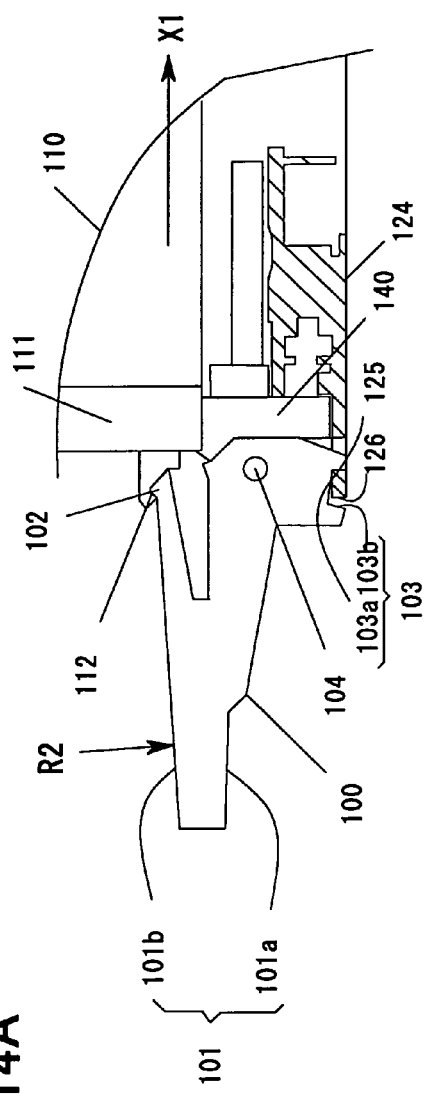
FIG. 14A is an enlarged side view, partly in section, of an essential part of the conventional circuit board 110 illustrating the state of a lockable part of the insertion-extraction handle engaged with a handle locking part after the insertion of the circuit board 110 into the subrack 120.
Figure 14B:
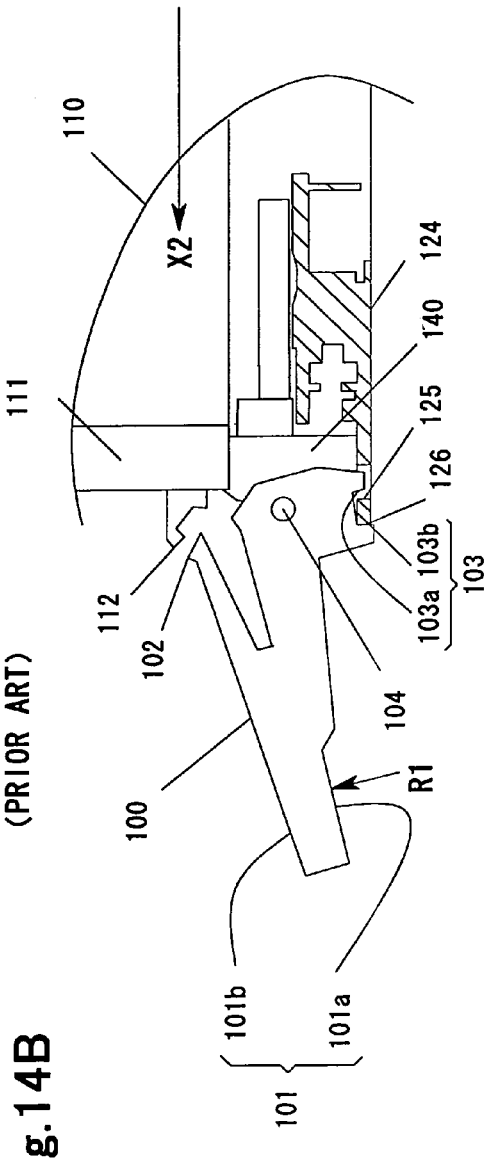
FIG. 14B is an enlarged side view, partly in section, of an essential part of the conventional circuit board 110 illustrating the state of the lockable part of the insertion-extraction handle disengaged from the handle locking part.

The subrack 1 shown in FIG. 1 has a configuration generally the same as that of the subrack 120 shown in FIGS. 12A and 12B. As shown in FIG. 3B, the subrack 1 has front rails 11, and a handle hooking part 12 engageable with a frame engaging part 52 of a hereinafter described insertion-extraction handle 5 is formed generally at the front end (the X2 side end in the drawing) of each front rail 11. The subrack 1 has a front face (X2 side face) with female threaded holes (not shown) for threadedly receiving fixing screws 7, which will be described later.

The board units 2 shown in FIG. 1 are aligned in parallel to the insertion and extraction direction (X1–X2 direction) thereof and removably attached to the subrack 1. As shown in FIG. 2A, the board unit 2 has a board body 3 on which electronic components are mounted, a panel body 4 for fixedly supporting the board body 3, a pair of upper and lower insertion-extraction handles 5 supported by the panel body 4 for rotation (in the Z1 and Z2 directions), a pair of upper and lower fixing screws 7 for securely fixing the panel body 4 to the subrack 1.

As shown in FIG. 3B, each of the fixing screws 7 has a knob 72 and a threaded part 71 to be threaded into the subrack 1. The board unit 2 has a pair of upper and lower spring units 6 non-fixedly (resiliently, in this example) held in a pair of upper and lower spring receiving holes 45, respectively, as stopper insertion holes formed in the panel body 4. The spring receiving hole 45 and spring unit 6 on the lower side (Z2 side) are not shown. In this embodiment, vertically paired components are vertically symmetric (mirror symmetrical) with each other unless otherwise stated. Thus, only the component on the upper side (Z1 side) will be described for the sake of convenience.

As shown in FIG. 4B, the panel body 4 has a generally flat side panel 41 disposed in parallel to the board body 3, a generally flat front panel 42 extending from the front end (X2 side end) of the side panel 41 in a direction generally perpendicular to the side panel 41 (in the Y1 direction), and a folded-back part 43 extending backward (in the X1 direction) from one end (Y1 side end) of the front panel 42.

The side panel 41 has a handle pin 44 extending sideward (in the Y1 direction) from a position close to its front end (X2 side end) and upper end (Z1 side end). In this example, the handle pin 44 has a large-diameter portion 44a and a small-diameter portion 44b.

The other end (Y2 side end) of the front panel 42 has a notch 46 at a position in the vicinity of the handle pin 44 so that the motion of the insertion-extraction handle 5 cannot be hindered. The other end (Y2 side end) of the front panel 42 has a generally rectangular spring receiving hole 45 formed therethrough at a position slightly lower than (on the Z2 side of) the notch 46.

The material and configuration of the panel body 4 are not specifically limited. Preferably, the panel body 4 has a one-piece body formed by stamping and bending a thin metal plate.

The insertion-extraction handle 5 has a base part 54, a frame engaging part 52 formed continuously with the base part 54, a rod part 56 extending from the base part 54, a stopper part 53 formed on an intermediate portion of the rod part 56, and an operation part 51 formed at the other end of the rod part 56. As shown in FIGS. 4A and 4B, the insertion-extraction handle 5 has a generally flat shape with a generally uniform thickness in the Y1–Y2 direction. That is, the constitutional elements of the insertion-extraction handle 5 (the base part 54, the frame engaging part 52, the rod part 56, the stopper part 53 and the operation part 51) has a generally same thickness (in the Y1–Y2 direction) and are generally in the same plane.

A through hole 55 is formed generally at the center of the base part 54. Since the large-diameter portion 44a of the handle pin 44 is fitted into the through hole 55, the insertion-extraction handle 5 is rotatably supported by the side panel 42 of the panel body 4.

The frame engaging part 52 has two protrusions and a recess between the protrusions. When the operation part 51 is rotated to a specific fixed position (the position shown in FIG. 3A), the frame engaging part 52 is engaged with the handle hooking part 12 of the front rail 11 of the subrack 1, and when the operation part 51 is rotated to a specific release position (the position shown in FIG. 3B), the frame engaging part 52 is disengaged from the handle hooking part 12.

The stopper part 53 has an end having a generally heart shape. When the operation part 51 is rotated to the fixed position (the position shown in FIG. 3A), the stopper part 53 is inserted into the spring receiving hole 45, and when the operation part 51 is rotated to the release position (the position shown in FIG. 3B), the stopper part is extracted from the spring receiving hole 45.

The material and configuration of the insertion-extraction handle 5 are not specifically limited. For example, the insertion-extraction handle 5 may have a one-piece body made of a resin or formed by stamping a metal plate.

As shown in FIG. 4B, the board body 3 has a through hole 31 with a diameter generally the same as the external diameter of the small-diameter portion 44b of the handle pin 44 at a position close to its front end 32 (X2 side end) and upper end 33 (Z1 side end). The small-diameter portion 44b of the handle pin 44 is inserted into the through hole 31 and fixed to the handle pin 44 by a screw (not shown) or the like. In this embodiment, the board body 3 is secured to the panel body 4 at board fixing points (not shown) other than the point where the handle pin 44 is secured.

As shown in FIG. 4B, the board unit 2 has a structure in which the side panel 41, the base part 54 of the insertion-extraction handle 5, and the board body 3 are stacked in this order in the transverse direction (from the Y2 side to the Y1 side). The dimensions of the members are determined such that the base part 54 of the insertion-extraction handle 5 does not interfere with the side panel 41 and the board body 3 when it is rotated about the handle pin 44.

As shown in FIGS. 3A, 3B, 4A and 4B, the base part 54 of the insertion-extraction handle 5 is substantially located inside the front panel 42. The rod part 56 is located outside the front panel 42 and extends adjacent to and generally parallel to the front panel 42 when the operation part 51 is in the fixed position, and is located outside the front panel 42 and erected from the front panel 42 when the operation part 51 is in the release position. The stopper part 53 is located inside the front panel 42 when the operation part 51 is in the fixed position, and is located outside the front panel 42 when the operation part 51 is in the release position.

First spring parts 61 (described later) of the spring unit 6 are located inside the front panel 42. Second spring parts 62 (described later) of the spring unit 6 are substantially located inside the front panel 42 (that is, except linear parts 62c).

As shown in FIG. 5A, the spring unit 6 has a bridge part 63 (constituted of a bridge plate 63b, and rising pieces 63a extending generally perpendicular to the bridge plate 63b from both ends of the bridge plate 63b) having a U-shape in a cross-section (YZ cross-section) taken perpendicular to the longitudinal direction thereof (X1–X2 direction), a pair of upper and lower (Z1 side and Z2 side) second spring parts 62 as a pair of insertion hole engaging parts extending forward (in the X2 direction) and slightly outward (in the Z1 and Z2 directions) from the front ends (X2 side ends) of the rising pieces 63a of the bridge part 63, and a pair of upper and lower (Z1 side and Z2 side) first spring parts 61 as a pair of main spring parts bent inward into a generally U-shape from the rear ends (X1 side ends) of the rising pieces 63a of the bridge part 63 and extending forward (in the X2 direction).

Each of the first spring parts 61 has a convex part 61a having a generally arcuate shape which is convex inward at its front end. That is, as shown in FIG. 3A, the convex parts 61a have a shape that fits the outer shape of the stopper part 53 of the insertion-extraction handle 5 and can hold it. Thus, when the stopper part 53 of the insertion-extraction handle 5 is inserted into the spring receiving hole 45, the convex parts 61a are brought into contact with the stopper part 53 and applies a prescribed resistance to the insertion of the stopper part 53, and when the stopper part 53 is extracted from the spring receiving hole 45, the convex parts 61a are brought into contact with the stopper part 53 and applies a prescribed resistance to the extraction of the stopper part 53.

As shown in FIG. 5A, the front end of each of the second spring parts 62 has a convex part 62a having a generally arcuate shape which is convex outward, a convex part 62b extending from the convex part 62a and having a generally U-shape which is convex inward, and a linear part 62c extending outward from the convex part 62b. To fit the spring unit 6 in the spring receiving hole 45, U-shaped ends 61b of the first spring parts 61 are inserted into the spring receiving hole 45 from front (X2 side) to rear (X1 side) until it reaches the state shown in FIG. 5A. In this state, the spring unit 6 cannot be removed from the spring receiving hole 45 unless the convex parts 62a are deformed inward against the resiliency of the second spring parts 62.

That is, the convex parts 62a are in contact with the upper and lower edges (Z1 and Z2 side edges) of the rear side (X1 side) of the spring receiving hole 45 so that the resistance to removal of the spring unit 6 (resistance to removal of the spring unit 6 at the time of extraction of the stopper part 53) in the forward direction (X2 direction) can be greater than a force (force in the X2 direction) from the stopper part 53 corresponding to the resistance to the extraction of the stopper part 53. Also, the linear parts 62c are in contact with the upper and lower edges (Z1 and Z2 side edges) of the front side (X2 side) of the spring receiving hole 45 so that the resistance to removal of the spring unit 6 (resistance to removal of the spring unit 6 at the time of insertion of the stopper part 53) in the backward direction (X1 direction) can be greater than a force (force in the X1 direction) from the stopper part 53 corresponding to the resistance to the insertion of the stopper part 53.

As shown in FIG. 4B, most of the spring unit 6 is located in a gap in the transverse direction (Y1–Y2 direction) between the side panel 41 and the board body 3 as in the case with the base part 54 of the insertion-extraction handle 5.

The material and configuration of the spring unit 6 are not specifically limited. Preferably, the spring unit 6 has a one-piece body formed by stamping and bending a thin metal plate for a spring.

Figure 6B:
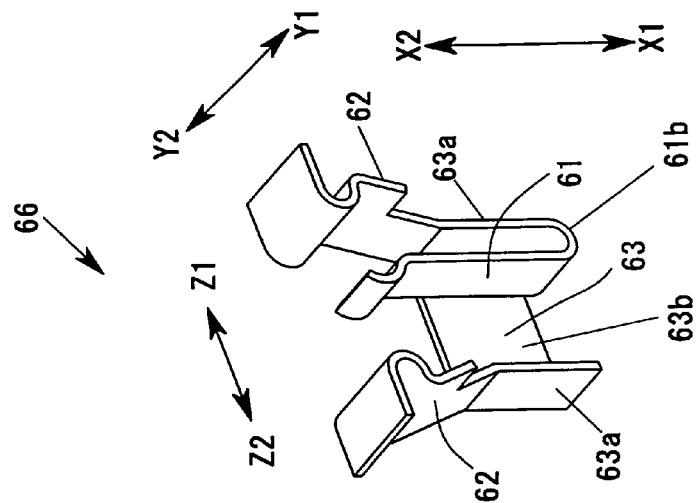
FIG. 6B is a perspective view illustrating the configuration of the spring unit 66.
Figure 6A:
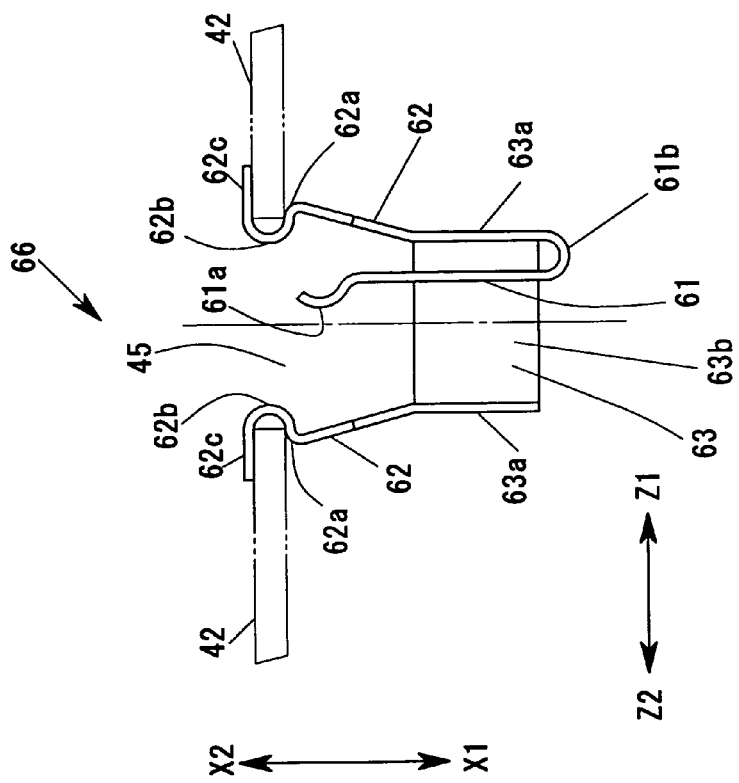
FIG. 6A is a right side view of a spring unit 66 as another example of the spring unit for use in the board unit 2.

FIG. 6A is a right side view of a spring unit 66 as another example of the spring unit for use in the board unit 2. FIG. 6B is a perspective view illustrating the configuration of the spring unit 66. As shown in FIG. 6A, the spring unit 66 is different from the spring unit 6 having a pair of first spring parts 61 in that it has only one first spring part 61. That is, the spring unit 66 shown in FIG. 6A is obtained by removing one of the paired first spring parts 61, which is the one that is farther from the center of rotation of the insertion-extraction handle 5 with respect to the panel body 4, from the spring unit 6 shown in FIG. 5A. The other configuration of the spring unit 66 is the same as that of the spring unit 6. The spring unit 66 constituted as described above can smoothly receive the stopper part 53 which is inserted through an arc about the handle pin 44 as shown in FIG. 3B.

The operation to insert the board unit 2 into the subrack 1 will be described. First, the board unit 2 is placed in position in the subrack 1 as shown in FIG. 3B, and pressed backward (in the X1 direction) along a guide rail (not shown) in the subrack 1. At this time, the operation part 51 of the insertion-extraction handle 5 has to be rotated in the R2 direction and kept in the release position (the position shown in FIG. 3B). The insertion-extraction handle 5 may be urged in the R2 direction by urging means such as a spring so that the operation part 51 of the insertion-extraction handle 5 is kept in the release position when the board unit 2 has been released (extracted).

When the board unit 2 reaches the bottom of the subrack 1, the operation part 51 is rotated in the R1 direction until it reaches the fixed position (the position shown in FIG. 3A). Then, the frame engaging part 52 of the insertion-extraction handle 5 is engaged with the handle hooking part 12 of the subrack 1, and the stopper part 53 of the insertion-extraction handle 5 is resiliently engaged with the convex parts 61a (see FIG. 5A) of the first spring parts 61 of the spring unit 6. The operation part 51 of the insertion-extraction handle 5 is thereby held in the fixed position. To fix the board unit 2 more securely, the fixing screw 7 is threaded into the subrack 1.

The operation to extract the board unit 2 from the subrack 1 will be described. When the fixing screw 7 has been tightened, it is released. The operation part 51 of the insertion-extraction handle 5 is rotated from the state shown in FIG. 3A in the R2 direction. Then, the resilient engagement between the stopper part 53 of the insertion-extraction handle 5 and the convex parts 61a (see FIG. 5A) of the first spring parts 61 of the spring unit 6 are released and the engagement between the frame engaging part 52 of the insertion-extraction handle 5 and the handle hooking part 12 of the subrack 1 is released. When the board unit 2 is extracted forward (in the X2 direction), the board unit 2 reaches the state shown in FIG. 3B.

The invention described above can be understood as follows.

That is, a board unit removably attachable to a board housing frame, comprising: a board body; a panel body for fixedly supporting the board body, the panel body having a spring receiving hole; a spring unit held in the spring receiving hole; and an insertion-extraction handle rotatably supported by the panel body, the insertion extraction handle having an operation part, a frame engaging part configured to be engaged with a part of the board housing frame when the operation part is rotated to a specific fixed position and to be disengaged from the board housing frame when the operation part is rotated to a specific release position, and a stopper part configured to be inserted into the spring receiving hole when the operation part is rotated to the fixed position and to be extracted from the spring receiving hole when the operation part is rotated to the release position; the spring unit having at least one first spring part which is brought into contact with the stopper part when the stopper part is inserted into the spring receiving hole and applies a prescribed resistance to the insertion of the stopper part and which is brought into contact with the stopper part when the stopper part is extracted from the spring receiving hole and apply a prescribed resistance to the extraction of the stopper part, and second spring parts which are resiliently engaged with the spring receiving hole and which are configured to generate a resistance to removal of the spring unit which is greater than the resistance to the insertion of the stopper part between the spring unit and the spring receiving hole when the stopper part is inserted into the spring receiving hole and to generate a resistance to removal of the spring unit which is greater than the resistance to the extraction of the stopper part between the spring unit and the spring receiving hole when the stopper part is extracted from the stopper receiving hole.

The present invention constituted as above has the following technical effects. Since the spring unit is constituted separately from the insertion-extraction handle, the degree of freedom in designing and producing the spring unit is high. Thus, a spring unit which can provide a desired resistance to extraction of the stopper part and has high durability can be obtained easily. Since the spring unit is not fixedly secured but resiliently held in the spring receiving hole, the spring unit is less likely to undergo excessive stress or uneven wear which may occur when it is fixedly secured. Thus, the spring unit can have a long service life. Also, since the spring unit can be fitted in the spring receiving hole only by inserting it against the resilient force of the second spring part, there is no need for a process of tacking and so on and the production cost can be reduced. That is, there can be obtained a board unit having an insertion-extraction handle locking structure with which a desired locking force can be easily generated and the locking force is hardly lowered, and which is low in production cost.

Figure 7A:
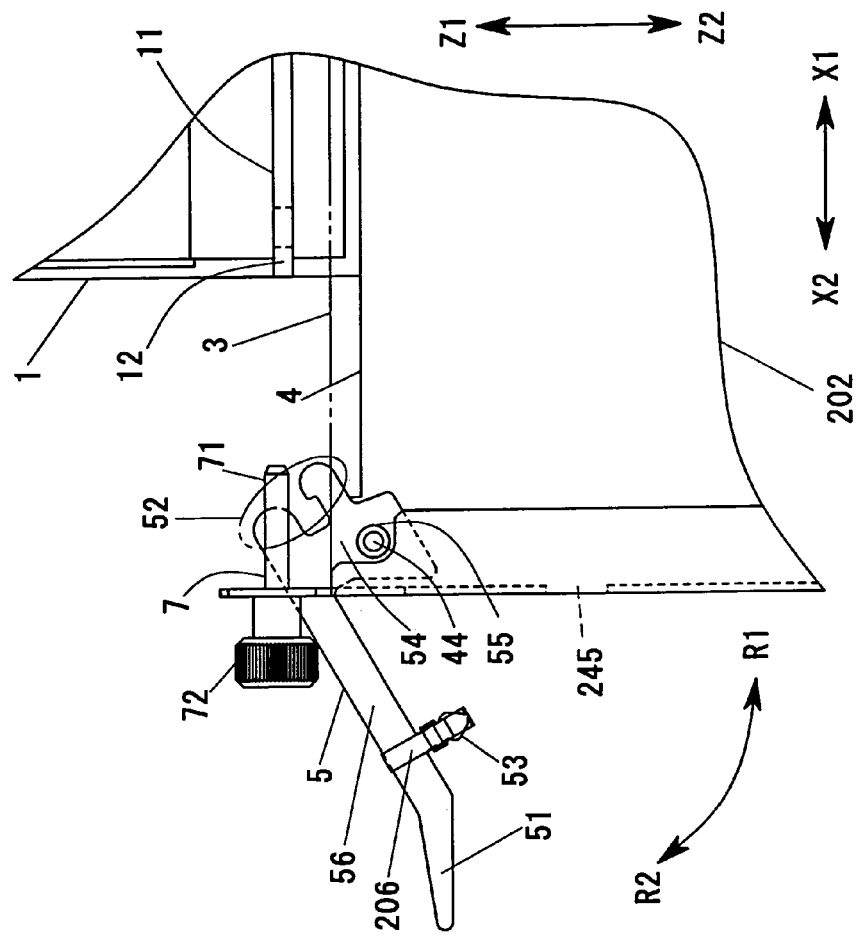
FIG. 7A is a right side view illustrating in detail a part of a board unit 202 according to another embodiment of the present invention inserted into the subrack 1.
Figure 7B:
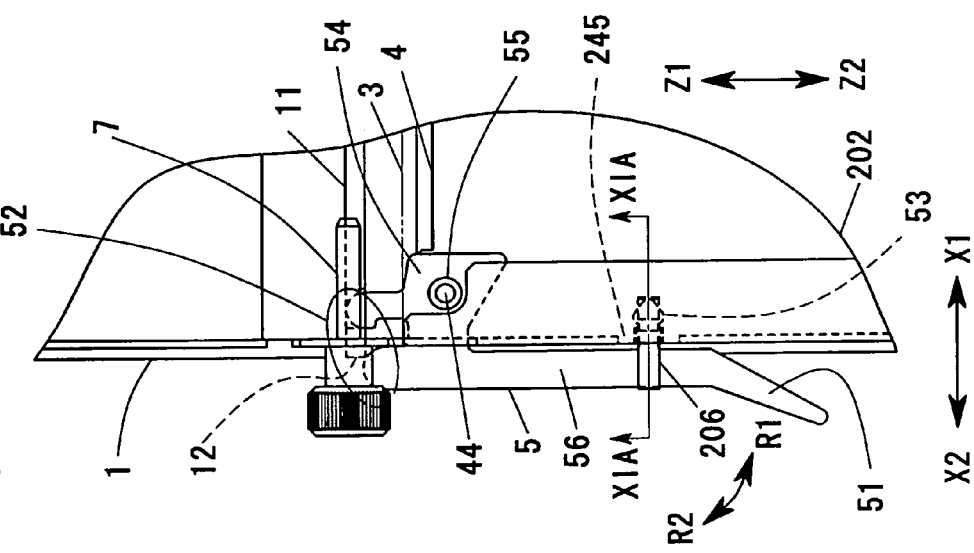
FIG. 7B is a right side view illustrating in detail a part of the board unit 202 extracted from the subrack 1.

FIG. 7A is a right side view illustrating in detail a part of a board unit 202 according to another embodiment of the present invention inserted into the subrack 1, which corresponds to FIG. 3A in the above embodiment. FIG. 7B is a right side view illustrating in detail a part of the board unit 202 extracted from the subrack 1, which corresponds to FIG. 3B in the above embodiment.

In the board unit 2 of the above embodiment, the spring unit 6 is held in spring receiving hole 45 as a stopper insertion hole provided in the panel body 4. In the board unit 202 of this embodiment, the spring unit 206 is held on the insertion-extraction handle 5.

That is, the board unit 202 of this embodiment and the board unit 2 of the above embodiment are the same in configuration except for the shape and positions of the spring units. In this embodiment, the same parts are designated by similar numerals as a general rule.

FIG. 8A is a perspective view of the spring unit 206 before being attached to the insertion-extraction handle 5. FIG. 8B is a perspective view of the spring unit 206 as viewed from an angle different from that of FIG. 8A. In FIGS. 8A and 8B, the symbols X1, X2, Y1, Y2, Z1 and Z2 indicating the directions are expressed in correspondence with the state of the stopper part 53 of the insertion-extraction handle 5 inserted into a stopper insertion hole 245 of the panel body 4.

Figure 9A:
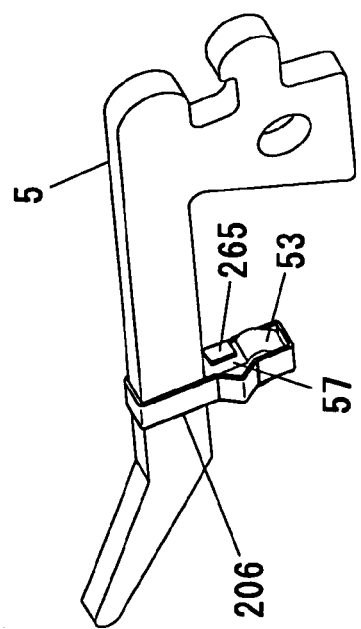
FIGS. 9A and 9B are views for explaining the procedure for attaching the spring unit 206 to the insertion-extraction handle 5.
Figure 9B:
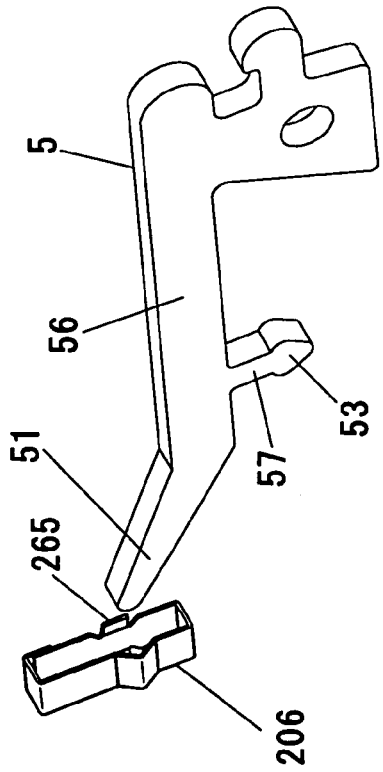

FIGS. 9A and 9B are views for explaining the procedure for attaching the spring unit 206 to the insertion-extraction handle 5.

FIGS. 10A, 10B, 11A and 11B are views for explaining the state of the stopper part 53 of the insertion-extraction handle 5 at the time of being inserted into or extracted from the stopper insertion hole 245 of the panel body 4. The positions and shape of the stopper insertion holes 245 are not specifically limited. In this embodiment, the positions and the shape of the stopper insertion holes 245 are the same as those of the spring receiving holes 45 in the above embodiment.

In the board unit 202 of this embodiment, the spring unit 206 is held on the insertion-extraction handle 5 at a position in the vicinity of the stopper part 53 as shown in FIGS. 7A and 7B.

As shown in FIGS. 8A and 8B, the spring unit 206 has a main spring part 261 and a handle engaging part 262 integrally formed of a plate spring material.

The main spring part 261 has a V-shape with a ridge 261c extending generally perpendicular to the direction in which the stopper part 53 of the insertion-extraction handle 5 shown in FIG. 7A is inserted into or extracted from the stopper insertion hole 245 of the panel body 4 (X1–X2 direction). The handle engaging part 262 has a first hook part 262a and a second hook part 262b.

The first hook part 262a extends from an insertion side (X1 side) foot 261a of the main spring part 261 in the insertion direction (X1 direction) and is bent into a generally U-shape. As shown in FIG. 10B, the first hook part 262a prevents the spring unit 206 from being detached from the insertion-extraction handle 5 in the extraction direction (X2 direction) when the stopper part 53 of the insertion-extraction handle 5 is moved in the X1 direction and inserted into the stopper insertion hole 245 of the panel body 4.

The second hook part 262b extends from an extraction side (X2 side) foot 261b of the mainspring part 261 in the extraction direction (X2 direction) and bent into a generally U-shape oriented opposite to the first hook part 262a. As shown in FIG. 11B, the second hook part 262b prevents the spring unit 206 from being detached from the insertion-extraction handle 5 in the insertion direction (X1 direction) when the stopper part 53 of the insertion-extraction handle 5 is moved in the X2 direction and extracted from the stopper insertion hole 245 of the panel body 4. The foot 261a, the foot 261b and the ridge 261c are generally parallel to each other.

The spring unit 206 also has a backside part 263 connecting the ends of the first and second hook parts 262a and 262b opposite the main spring part 261. That is, the spring unit 206 has the first hook part 262a, the main spring part 261, the second hook part 262b and the backside part 263 connected in a loop in this order.

In this embodiment, the backside part 263 has a generally rectangular shape, and one end of the backside part 263 is formed continuously with the first hook part 262a. The other end of the backside part 263 is overlapped with the end of the second hook part 262b. The part where the other end of the backside part 263 and the end of the second hook part 262b are overlapped will be referred to as "overlapped part 264." At the overlapped part 264, the other end of the backside part 263 and the end of the second hook part 262b are not joined and movable relative to each other.

The spring unit 206 has a pair of locking pieces 265 for preventing the spring unit 206 mounted on the insertion-extraction handle 5 from moving in the longitudinal direction (Z1–Z2 direction in FIG. 7A) of the rod part 56 of the insertion-extraction handle 5. In this embodiment, the locking pieces 265 extend from intermediate portions of Z1 side end and Z2 side end of the backside part 263.

As shown in FIG. 8B, in the spring unit 206 before being attached to the insertion-extraction handle 5, the locking pieces 265 are slightly bent at the boundary with the backside part 263 so that they can be easily bent after the insertion-extraction handle 5 is inserted into the loop-shaped spring unit 6. The bend angle is so small that the locking pieces 265 do not interfere with the insertion of the insertion-extraction handle 5.

To attach the spring unit 206 to the insertion-extraction handle 5, the insertion-extraction handle 5 is drawn through the loop-shaped spring unit 206 from the operation part 51 side as shown in FIG. 9A, and the spring unit 206 is moved generally parallel to the longitudinal direction of the rod part 56 to a position in the vicinity of the stopper part 53.

Then, the paired locking pieces 265 are bent to clamp a stopper connection part 57 connecting the rod part 56 and the stopper part 53 of the insertion-extraction handle 5 from both sides as shown in FIG. 9B. The spring unit 206 is thereby prevented from being moved generally parallel to the longitudinal direction of the rod part 56 of the insertion-extraction handle 5.

The state of the stopper part 53 of the insertion-extraction handle 5 to which the spring unit 206 has been attached at the time when it is inserted into the stopper insertion hole 245 of the panel body 4 will be described. When the insertion-extraction handle 5 is rotated in the R1 direction from the state shown in FIG. 7B (which corresponds to the release position) to the state shown in FIG. 7A (which corresponds to the fixed position).the main spring part 261 of the spring unit 206 is brought into contact with an edge 245a (the right end, that is, Y1 side end in this embodiment) of the stopper insertion hole 245 as shown in FIG. 10A.

When the insertion-extraction handle 5 is further rotated in the R1 direction, the main spring part 261 of the spring unit 206 is pressed by the edge 245a of the stopper insertion hole 245 and resiliently deformed as shown in FIG. 10B. That is, the height (the dimension in the Y1–Y2 direction) of the main spring part 261 is lowered. The other end of the backside part 263 and the end of the second hook part 262b at the overlapped part 264 are not joined but movable relative to each other so that the main spring part 261 can be easily deformed as described above.

The overlapping length (the length in the X1–X2 direction) of the overlapped part 264 is greater than the distance which the other end of the backside part 263 and the end of the second hook part 262b are moved in the X1 or X2 direction relative to each other when the stopper part 53 of the insertion-extraction handle 5 is inserted into or extracted from the stopper insertion hole 245 of the panel body 4.

When the insertion-extraction handle 5 is further rotated in the R1 direction, it reaches the state shown in FIG. 11A (which corresponds to the fixed position). In this state, the spring unit 206 is returned to the state before the resilient deformation (the state same as the state shown in FIG. 10A).

When the insertion-extraction handle 5 is rotated in the R2 direction from the state shown in FIG. 11A or the state shown in FIG. 7A (which correspond to the fixed position), the spring unit 206 is resiliently deformed as shown in FIG. 11B and returned to the state shown in FIG. 10A.

As described above, when the stopper part 53 of the insertion-extraction handle 5 is inserted into the stopper insertion hole 245, the main spring part 261 of the spring unit 206 is brought into contact with the edge 245a of the stopper insertion hole 245 and generates a resistance to the insertion of the stopper part 53. Also, when the stopper part 53 is extracted from the stopper insertion hole 245, the main spring part 261 of the spring unit 206 is brought into contact with the edge 245a of the stopper insertion hole 245 and generates a resistance to the extraction of the stopper part 53.

The spring unit 206 has a handle engaging part 262 attached to the insertion-extraction handle 5 non-fixedly (that is, for movement at a prescribed distance in the direction in which the stopper part 53 is inserted into or extracted from the stopper insertion hole 245 (X1 or direction)). When the stopper part 53 is inserted into the stopper insertion hole 245, the first hook part 262a of the handle engaging part 262 generates a resistance to removal of the spring unit 206 which is greater than the resistance to the insertion of the stopper part 53 between the spring unit 206 and the insertion-extraction handle 5. When the stopper part 53 is extracted from the stopper insertion hole 245, the second hook part 262b of the handle engaging part 262 generates a resistance to removal of the spring unit 206 which is greater than the resistance to the extraction of the stopper part 53 between the spring unit 206 and the insertion-extraction handle 5.

The board unit according to the present invention is a board unit which is removably attachable to a board housing frame. The board unit has a board body; a panel body for fixedly supporting the board body, the panel body having a stopper insertion hole; an insertion-extraction handle rotatably supported by the panel body; and a spring unit non-fixedly held either in the stopper insertion hole or on the insertion-extraction handle. The insertion-extraction handle has an operation part; a frame engaging part configured to be engaged with a part of the board housing frame when the operation part is rotated to a specific fixed position and to be disengaged from the board housing frame when the operation part is rotated to a specific release position; and a stopper part configured to be inserted into the stopper insertion hole when the operation part is rotated to the fixed position and to be extracted from the stopper insertion hole when the operation part is rotated to the release position. The spring unit has at least one main spring part which, when the stopper part is inserted into the stopper insertion hole, applies a prescribed resistance to the insertion of the stopper part on the insertion-extraction handle and which, when the stopper part is extracted from the stopper insertion hole, applies a prescribed resistance to the extraction of the stopper part on the insertion-extraction handle.

Since the spring unit is constituted separately from the insertion-extraction handle, the degree of freedom in designing and producing the spring unit is high. Thus, a spring unit which can provide a desired resistance to extraction of the stopper part and has high durability can be obtained easily. Since the spring unit is not fixedly secured but non-fixedly held in the stopper insertion hole or on the insertion-extraction handle, the spring unit is less likely to undergo excessive stress or uneven wear which may occur when it is fixedly secured. Thus, the spring unit can have a long service life. Since there is no need to fixedly secure the spring unit when it is fitted in the stopper insertion hole or attached to the insertion-extraction handle, there is no need for a process of tacking and so on and the production cost can be reduced.

That is, there can be obtained a board unit having an insertion-extraction handle locking structure with which a desired locking force can be easily generated and the locking force is hardly lowered, and which is low in production cost.

In the board unit according to the present invention, the board body is disposed generally in parallel to direction in which the board unit is inserted into or extracted from the board housing frame. The panel body has a generally flat side panel disposed generally in parallel to the board body, and a generally flat front panel extending from the extraction side end of the side panel in a direction perpendicular to the direction in which the board unit is inserted into or extracted from the board housing frame. The stopper insertion hole is formed through the front panel. The insertion-extraction handle also has a base part rotatably supported by the panel body, and a rod part extending from the base part. The frame engaging part is formed continuously with the base part. The stopper part is formed on an intermediate portion of the rod part. The operation part is formed on the other end of the rod part. The base part is located substantially inside the front panel. The rod part is configured to be located outside the front panel and extends adjacent to and generally parallel to the front panel when the operation part is in the fixed position, and to be located outside the front panel and erected from the front panel when the operation part is in the release position. The stopper part is configured to be located inside the front panel when the operation part is in the fixed position, and to be located outside the front panel when the operation part is in the release position. The main spring part is configured to be located inside the front panel at least when the operation part is in the fixed position.

Thus, when the operation part of the insertion-extraction handle is in the fixed position, that is, when the board unit is housed and fixed in the board housing frame in a normal use state, the height of the insertion-extraction handle protruded outside the front panel is low. When such a board housing frame for housing such board units is used, there can be obtained a compact electronic apparatus unit whose dimension in the direction in which the board units are inserted or extracted (depth, for example) is small in a normal use state.

The board unit according to the present invention is characterized in that the base part of the insertion-extraction handle is located in a gap between the board body and the side panel, and the stopper part and the main spring part are located in the gap at least when the operation part is in the fixed position.

Thus, the base part of the insertion-extraction handle and the positions of the stopper part and the main spring part at least at the time when the operation part is in the fixed position can be located in the plane of projection of the board body and the side panel in a direction perpendicular thereto. As a result, there can be obtained a compact electronic apparatus unit whose dimension in the direction in which the board units are inserted or extracted (depth, for example) is small in a normal use state.

The board unit according to the present invention is characterized by further comprising urging means for urging the insertion-extraction handle in a direction in which the operation part of the insertion-extraction handle is rotated from the fixed position to the release position.

Thus, since the board housing frame and the frame engaging part of the insertion-extraction handle do not interfere with each other when the board unit is inserted into or extracted from the board housing frame, the board unit can be easily inserted into or extracted from the board housing frame.

In the board unit according to the present invention, the spring unit is held in the stopper insertion hole. The main spring part is configured to be brought into contact with the stopper part when the stopper part is inserted into the stopper insertion hole and deformed to generate a resistance to the insertion of the stopper part, and to be brought into contact with the stopper part when the stopper part is extracted from the stopper insertion hole and deformed to generate a resistance to the extraction of the stopper part. The spring unit also has at least one insertion hole engaging part which is non-fixedly engaged with the stopper insertion hole and which is configured to generate a resistance to removal of the spring unit which is greater than the resistance to the insertion of the stopper part between the spring unit and the stopper insertion hole when the stopper part is inserted into the stopper insertion hole and to generate a resistance to removal of the spring unit which is greater than the resistance to the extraction of the stopper part between the spring unit and the stopper insertion hole when the stopper part is extracted from the stopper insertion hole.

That is, the spring unit is non-fixedly engaged with the stopper insertion hole of the panel body by the insertion hole engaging part, and the engagement is maintained even when the stopper part of the insertion-extraction handle is inserted into the stopper insertion hole and extracted from the stopper insertion hole.

The board unit according to the present invention is characterized in that the main spring part and the insertion hole engaging part of the spring unit are integrally formed of a plate spring material.

For example, the spring unit has a bridge part having a generally U-shape in a cross-section taken perpendicular to the direction in which the stopper part is inserted into or extracted from the stopper insertion hole, and constituted of a bridge plate and rising pieces extending generally perpendicular to the bridge plate from both ends of the bridge plate. The spring unit has a pair of insertion hole engaging parts extending obliquely away from each other from extraction side ends of the paired rising pieces of the bridge part. The spring unit also has a pair of main spring parts bent into a U-shape from the insertion side ends of the paired rising pieces in directions toward each other and extending in the direction in which the stopper part is extracted.

Alternatively, the spring unit has a bridge part having a generally U-shape in a cross-section taken perpendicular to the direction in which the stopper part is inserted into or extracted from the stopper insertion hole, and constituted of a bridge plate and rising pieces extending generally perpendicular to the bridge plate from both ends of the bridge plate. The spring unit has a pair of insertion hole engaging parts extending obliquely away from each other from the extraction side ends of the paired rising pieces of the bridge part. The spring unit also has a main spring part bent into a U-shape from the insertion side end of one of the paired rising pieces and extending between the paired insertion hole engaging parts in the direction in which the stopper part is extracted.

The spring unit can be easily obtained by stamping and bending a metal plate.

In the board unit according to the present invention, the spring unit is held on the insertion-extraction handle at a position in the vicinity of the stopper part. The main spring part is configured to be brought into contact with an edge of the stopper insertion hole when the stopper part is inserted into the stopper insertion hole and deformed to generate a resistance to the insertion of the stopper part, and to be brought into contact with the edge of the stopper insertion hole when the stopper part is extracted from the stopper insertion hole and deformed to generate a resistance to the extraction of the stopper part. The spring unit also has a handle engaging part which is non-fixedly engaged with the insertion-extraction handle and which is configured to generate a resistance to removal of the spring unit which is greater than the resistance to the insertion of the stopper part between the spring unit and the insertion-extraction handle when the stopper part is inserted into the stopper insertion hole and to generate a resistance to removal of the spring unit which is greater than the resistance to the extraction of the stopper part between the spring unit and the insertion-extraction handle when the stopper part is extracted from the stopper insertion hole.

That is, the spring unit is non-fixedly engaged with the insertion-extraction handle at a position in the vicinity of the stopper part by the handle engaging part, and the engagement is maintained even when the stopper part of the insertion-extraction handle is inserted into the stopper insertion hole of the panel body and the stopper part is extracted from the stopper insertion hole.

The board unit according to the present invention is characterized in that the main spring part and the handle engaging part of the spring unit are integrally formed of a plate spring material.

For example, the main spring part of the spring unit has a V-shape with a ridge extending generally perpendicular to the direction in which the stopper part is inserted into or extracted from the stopper insertion hole. The handle engaging part has a first hook part extending from an insertion side foot of the main spring part in the insertion direction and bent into a generally U-shape for preventing the spring unit from moving in the extraction direction with respect to the insertion-extraction handle, and a second hook part extending from an extraction side foot of the main spring part in the extraction direction and bent into a generally U-shape oriented opposite the first hook part for preventing the spring unit from moving in the insertion direction with respect to the insertion-extraction handle.

The spring unit can be easily obtained by stamping and bending a metal plate.

Description has been made of the preferred embodiments of the present invention. The terminology employed herein is for the purpose of illustration but not of limitation. It should be understood that many changes and modification can be made within the scope of the appended claims without departing from the scope and spirit of the present invention. Also, while only typical embodiments have been described in detail, it will be understood by those skilled in the art that various modifications may be made therein without departing from the novel teaching and advantages of the present invention. Thus, such modifications are all included in the scope of the present invention.

What is claimed is:

1. A board unit removably attachable to a board housing frame, comprising:
   a board body;
   a panel body for fixedly supporting the board body, the panel body having a stopper insertion hole;
   an insertion-extraction handle rotatably supported by the panel body having:
   an operation part,
   a frame engaging part configured to be engaged with a part of the board housing frame when the operation part is rotated to a specific fixed position and to be disengaged from the board housing frame when the operation part is rotated to a specific release position, and
   a stopper part configured to be inserted into the stopper insertion hole when the operation part is rotated to the fixed position and to be extracted from the stopper insertion hole when the operation part is rotated to the release position; and
   a spring unit non-fixedly held either in the stopper insertion hole or on the insertion-extraction handle, the spring unit having a main spring part which, when the stopper part is inserted into the stopper insertion hole, applies a prescribed resistance to the insertion of the stopper part on the insertion-extraction handle, and which, when the stopper part is extracted from the stopper insertion hole, applies a prescribed resistance to the extraction of the stopper part on the insertion-extraction handle.

2. The board unit of claim 1, wherein the board body is disposed generally in parallel to the direction in which the board unit is inserted into or extracted from the board housing frame;
   wherein the panel body has:
   a generally flat side panel disposed generally in parallel to the board body, and
   a generally flat front panel extending from the extraction side end of the side panel in a direction generally perpendicular to the direction in which the board unit is inserted into or extracted from the board housing frame, the stopper insertion hole being formed through the front panel;
   wherein the insertion-extraction handle also has:
   a base part rotatably supported by. the panel body, and
   a rod part extending from the base part,
   the frame engaging part being formed continuously with the base part,
   the stopper part being formed on an intermediate portion of the rod part,
   the operation part being formed on the other end of the rod part,
   the base part being located substantially inside the front panel,
   the rod part being configured to be located outside the front panel and extend adjacent to and generally parallel to the front panel when the operation part is in the fixed position, and to be located outside the front panel and erected from the front panel when the operation part is in the release position,
   the stopper part being configured to be located inside the front panel when the operation part is in the fixed position, and to be located outside the front panel when the operation part is in the release position; and
   wherein the main spring part of the spring unit is configured to be located inside the front panel at least when the operation part is in the fixed position.

3. The board unit of claim 2, wherein the base part of the insertion-extraction handle is located in a gap between the board body and the side panel, and the stopper part of the insertion-extraction handle and the main spring part of the spring unit are located in the gap at least when the operation part is in the fixed position.

4. The board unit of claim 1, further comprising urging means for urging the insertion-extraction handle in the direction in. which the operation part of the insertion-extraction handle is rotated from the fixed position to the release position.

5. The board unit of claim 1, wherein the spring unit is held in the stopper insertion hole,
   the main spring part being configured to be brought into contact with the stopper part when the stopper part is inserted into the stopper insertion hole and deformed to generate a resistance to the insertion of the stopper part, and to be brought into contact with the stopper part when the stopper part is extracted from the stopper insertion hole and deformed to generate a resistance to the extraction of the stopper part,
   the spring unit also having an insertion hole engaging part which is non-fixedly engaged with the stopper insertion hole and which is configured to generate a resistance to removal of the spring unit which is greater than the resistance to the insertion of the stopper part between the spring unit and the stopper insertion hole when the stopper part is inserted into the stopper insertion hole, and to generate a resistance to removal of the spring unit which is greater than the resistance to the extraction of the stopper part between the spring unit and the stopper insertion hole when the stopper part is extracted from the stopper insertion hole.

6. The board unit of claim 5, wherein the main spring part and the insertion hole engaging part of the spring unit are integrally formed of a plate spring material.

7. The board unit of claim 1, wherein the spring unit is held on the insertion-extraction handle at a position in the vicinity of the stopper part,
   the main spring part is configured to be brought into. contact with an edge of the stopper insertion hole when the stopper part is inserted into the stopper insertion hole and deformed to generate a resistance to the insertion of the stopper part, and to be brought into contact with the edge of the stopper insertion hole when the stopper part is extracted from the stopper insertion hole and deformed to generate a resistance to the extraction of the stopper part,
   the spring unit also having a handle engaging part which is non-fixedly engaged with the insertion-extraction handle and which is configured to generate a resistance to removal of the spring unit which is greater than the resistance to the insertion of the stopper part between the spring unit and the insertion-extraction handle when the stopper part is inserted into the stopper insertion hole, and to generate a resistance to removal of the spring unit which is greater than the resistance to the extraction of the stopper part between the spring unit and the insertion-extraction handle when the stopper part is extracted from the stopper insertion hole.

8. The board unit of claim 7, wherein the main spring part and the handle engaging part of the spring unit are integrally formed of a plate spring material.

9. The board unit of claim 2, wherein the spring unit is held in the stopper insertion hole, the main spring part being configured to be brought into contact with the stopper part when the stopper part is inserted into the stopper insertion hole and deformed to generate a resistance to the insertion of the stopper part, and to be brought into contact with the stopper part when the stopper part is extracted from the stopper insertion hole and deformed to generate a resistance to the extraction of the stopper part, the spring unit also having an insertion hole engaging part which is non-fixedly engaged with the stopper insertion hole and which is configured to generate a resistance to removal of the spring unit which is greater than the resistance to the insertion of the stopper part between the spring unit and the stopper insertion hole when the stopper part is inserted into the stopper insertion hole, and to generate a resistance to removal of the spring unit which is greater than the resistance to the extraction of the stopper part between the spring unit and the stopper insertion hole when the stopper part is extracted from the stopper insertion hole.

10. The board unit of claim 9, wherein the main spring part and the insertion hole engaging part of the spring unit are integrally formed of a plate spring material.

11. The board unit of claim 2, wherein the spring unit is held on the insertion-extraction handle at a position in the vicinity of the stopper part, the main spring part is configured to be brought into contact with an edge of the stopper insertion hole when the stopper part is inserted into the stopper insertion hole and deformed to generate a resistance to the insertion of the stopper part, and to be brought into contact with the edge of the stopper insertion hole when the stopper part is extracted from the stopper insertion hole and deformed to generate a resistance to the extraction of the stopper part, the spring unit also having a handle engaging part which is non-fixedly engaged with the insertion-extraction handle and which is configured to generate a resistance to removal of the spring unit which is greater than the resistance to the insertion of the stopper part between the spring unit and the insertion-extraction handle when the stopper part is inserted into the stopper insertion hole, and to generate a resistance to removal of the spring unit which is greater than the resistance to the extraction of the stopper part between the spring unit and the insertion-extraction handle when the stopper part is extracted from the stopper insertion hole.

12. The board unit of claim 11, wherein the main spring part and the handle engaging part of the spring unit are integrally formed of a plate spring material.

13. The board unit of claim 3, wherein the spring unit is held in the stopper insertion hole, the main spring part being configured to be brought into contact with the stopper part when the stopper part is inserted into the stopper insertion hole and deformed to generate a resistance to the insertion of the stopper part, and to be brought into contact with the stopper part when the stopper part is extracted from the stopper insertion hole and deformed to generate a resistance to the extraction of the stopper part, the spring unit also having an insertion hole engaging part which is non-fixedly engaged with the stopper insertion hole and which is configured to generate a resistance to removal of the spring unit which is greater than the resistance to the insertion of the stopper part between the spring unit and the stopper insertion hole when the stopper part is inserted into the stopper insertion hole, and to generate a resistance to removal of the spring unit which is greater than the resistance to the extraction of the stopper part between the spring unit and the stopper insertion hole when the stopper part is extracted from the stopper insertion hole.

14. The board unit of claim 13, wherein the main spring part and the insertion hole engaging part of the spring unit are integrally formed of a plate spring material.

15. The board unit of claim 3, wherein the spring unit is held on the insertion-extraction handle at a position in the vicinity of the stopper part, the main spring part is configured to be brought into contact with an edge of the stopper insertion hole when the stopper part is inserted into the stopper insertion hole and deformed to generate a resistance to the insertion of the stopper part, and to be brought into contact with the edge of the stopper insertion hole when the stopper part is extracted from the stopper insertion hole and deformed to generate a resistance to the extraction of the stopper part, the spring unit also having a handle engaging part which is non-fixedly engaged with the insertion-extraction handle and which is configured to generate a resistance to removal of the spring unit which is greater than the resistance to the insertion of the stopper part between the spring unit and the insertion-extraction handle when the stopper part is inserted into the stopper insertion hole, and to generate a resistance to removal of the spring unit which is greater than the resistance to the extraction of the stopper part between the spring unit and the insertion-extraction handle when the stopper part is extracted from the stopper insertion hole.

16. The board unit of claim 15, wherein the main spring part and the handle engaging part of the spring unit are integrally formed of a plate spring material.

17. The board unit of claim 4, wherein the spring unit is held in the stopper insertion hole, the main spring part being configured to be brought into contact with the stopper part when the stopper part is inserted into the stopper insertion hole and deformed to generate a resistance to the insertion of the stopper part, and to be brought into contact with the stopper part when the stopper part is extracted from the stopper insertion hole and deformed to generate a resistance to the extraction of the stopper part, the spring unit also having an insertion hole engaging part which is non-fixedly engaged with the stopper insertion hole and which is configured to generate a resistance to removal of the spring unit which is greater than the resistance to the insertion of the stopper part between the spring unit and the stopper insertion hole when the stopper part is inserted into the stopper insertion hole, and to generate a resistance to removal of the spring unit which is greater than the resistance to the extraction of the stopper part between the spring unit and the stopper insertion hole when the stopper part is extracted from the stopper insertion hole.

18. The board unit of claim 17, wherein the main spring part and the insertion hole engaging part of the spring unit are integrally formed of a plate spring material.

19. The board unit of claim 4, wherein the spring unit is held on the insertion-extraction handle at a position in the vicinity of the stopper part,
- the main spring part is configured to be brought into contact with an edge of the stopper insertion hole when the stopper part is inserted into the stopper insertion hole and deformed to generate a resistance to the insertion of the stopper part, and to be brought into contact with the edge of the stopper insertion hole when the stopper part is extracted from the stopper insertion hole and deformed to generate a resistance to the extraction of the stopper part,
- the spring unit also having a handle engaging part which is non-fixedly engaged with the insertion-extraction handle and which is configured to generate a resistance to removal of the spring unit which is greater than the resistance to the insertion of the stopper part between the spring unit and the insertion-extraction handle when the stopper part is inserted into the stopper insertion hole, and to generate a resistance to removal of the spring unit which is greater than the resistance to the extraction of the stopper part between the spring unit and the insertion-extraction handle when the stopper part is extracted from the stopper insertion hole.

20. The board unit of claim 19, wherein the main spring part and the handle engaging part of the spring unit are integrally formed of a plate spring material.

* * * * *